United States Patent [19]

Lagadec

[11] Patent Number: 4,953,117

[45] Date of Patent: Aug. 28, 1990

[54] METHOD AND APPARATUS FOR CONVERTING SAMPLING FREQUENCIES

[75] Inventor: Roger Lagadec, Kanagawa, Japan

[73] Assignee: Sony Corporation, Tokyo, Japan

[21] Appl. No.: 288,960

[22] Filed: Dec. 23, 1988

[30] Foreign Application Priority Data

Dec. 29, 1987 [JP] Japan .................................. 62-332395

[51] Int. Cl.$^5$ ..................................... G06F 15/31
[52] U.S. Cl. .................................................. 364/724.10
[58] Field of Search ....................... 364/724.01, 724.10, 364/723

[56] References Cited

U.S. PATENT DOCUMENTS

| 4,020,332 | 4/1977 | Crochiere et al. | 364/724.1 |
| 4,460,890 | 7/1984 | Busby | 364/724.1 |
| 4,472,785 | 9/1984 | Kasuga | 364/724.1 |

FOREIGN PATENT DOCUMENTS

| 57-115015 | 7/1982 | Japan . | |
| 61-204700 | 9/1986 | Japan . | |
| 62-101112 | 5/1987 | Japan | 364/724.1 |

Primary Examiner—Gary V. Harkcom
Assistant Examiner—Long T. Nguyen
Attorney, Agent, or Firm—Alvin Sinderbrand

[57] ABSTRACT

A sampling frequency converter converts sampled input data having an input sampling frequency into sampled output data having a different output sampling frequency. The relative ratio between input data sample periods and output data sample periods is determined and averaged over a predetermined duration. A filter coefficient generator responds to the averaged input-/output sampling period ratio for generating data representing a set of predetermined filter coefficients which are used by a sampling filter circuit to convert the input data samples into output data samples of a different sampling frequency.

15 Claims, 12 Drawing Sheets

METHOD AND APPARATUS FOR CONVERTING SAMPLING FREQUENCIES

BACKGROUND OF THE INVENTION

1. Field of the Invention

This invention relates to a sampling frequency converter for converting a sequence of input data samples having an input sampling frequency into a sequence of output data samples having a different output sampling frequency. The present invention finds particular use in, for example, converting between sampling frequencies associated with different PCM audio signal transmission systems.

2. Description of the Prior Art

Various PCM signal transmission systems have been introduced, many of these using different sampling frequencies to digitize and transmit audio signals. For example, the so-called compact disk system encodes an audio signal as a PCM signal recorded at a sampling frequency on the order of about 44.1kHz. As another example, a PCM processor is known in which an input audio signal is sampled at a frequency of 44.056kHz, this sampling frequency being used both to encode and decode a PCM audio signal. As yet another example, broadcast satellite systems are known to broadcast PCM audio signals in what has been designated the A mode at a sampling frequency of 32kHz and at what has been designated the B mode at a sampling frequency of 48kHz. Often, these different PCM samples having different sampling frequencies are to be interchanged such that the PCM signal produced by one system is to be transmitted over a communications system which uses a different PCM sampling frequency, and this signal is to be used eventually by yet another system employing a still different sampling frequency. Thus, the ability to convert PCM signals in particular, and sampled data in general, from one sampling frequency to another is desirable.

A relatively simple, straightforward sampling frequency converter relies upon digital-to-analog conversion of a PCM signal which, subsequently, is re-converted to yet another PCM signal at a desired sampling frequency. That is, the input PCM signal is converted to analog form and this converted signal then is sampled at the desired output sampling frequency in an analog-to-digital converter to derive the PCM signal with the desired output sampling frequency. Such DAC-ADC processing is relatively complicated and expensive and is subject to significant deterioration in signal quality. It should be appreciated that quantizing errors are introduced into each analog-to-digital conversion and these quantizing errors are cumulative when an input analog signal first is digitized, then converted to analog form and then re-digitized, all for the purpose of modifying the sampling frequency of the resultant PCM audio signal.

Digital converters by which an input PCM signal is converted to a digital signal of desired sampling frequency, without requiring an intermediate analog conversion step, are known. One example is shown in FIG. 1 of the appended drawings and this figure relates to a sampling frequency converter disclosed in Japanese laid-open Patent Publications Nos. 57-115015 and 61-204700. The prior art sampling frequency converter shown in FIG. 1 is supplied with an input sampling clock signal $Fs_{(in)}$ having an input sampling frequency $fs_{(in)}$ and with an output sampling clock $Fs_{(out)}$ having an output sampling frequency $fs_{(out)}$. A sequence of input data samples $x_i$ with the input sampling frequency $fs_{(in)}$ is converted to a sequence of output data samples $y_j$ having the output sampling frequency $fs_{(out)}$. A phase locked loop (PLL) 102 receives the input sampling clock signal supplied to a terminal 101 and multiplies the input sampling frequency $fs_{(in)}$ by a factor $2^N$ (where, for example, $N=7$). As a result PLL 102 produces a high frequency clock signal of a frequency $2^N \cdot fs_{(in)}$. This high frequency clock signal is supplied to a counter 103 which is set in response to each pulse of the input sampling clock signal $Fs_{(in)}$ and is reset in response to each output sampling clock signal $Fs_{(out)}$. The output sampling clock signal is supplied to the reset input R of counter 103 and also to a latch input L of a N-bit register 105. The output of counter 103 also is coupled to register 105; and the count reached by the counter is transferred to and latched in the register upon the occurrence of an output sampling clock pulse.

As a result, the count reached by counter 103 and latched in register 105 is representative of the phase of the output sampling clock pulse with respect to the immediately preceding input sampling clock pulse. That is, the phase difference between the output sampling point and the immediately preceding input sampling point is represented by the N-bit count which is normalized to unity. This N-bit normalized phase difference is supplied to a calculating circuit 106.

Calculating circuit 106 functions to convert the input data samples $x_i$ to output data samples $y_j$ in response to each N-bit normalized phase difference supplied thereto by register 105. The converted output data samples are obtained at output terminal 108.

The relationship between the N-bit phase data stored in register 105 and represented as phase data $\phi_j$, input data samples $x_i$ and output data samples $y_j$ are graphically depicted in FIG. 2. Of course, if the input data samples are converted to analog form, the resultant analog signal would, ideally, be identical to the analog representation of output data sample $y_j$. Calculating circuit 106 functions to calculate the sample value of an output data sample $y_j$ at an output sampling point in response to an input data sample $x_i$ by using multinomial interpolation or digital filtering, as described below.

As an example, and with reference to FIG. 3, the method of calculating an approximate value of an output data sample by multinomial interpolation is represented. Here, the multinomial interpolation is interpolation of the first degree, commonly referred to as linear interpolation. From FIG. 3, it is seen that samples $x_i$ and $x_{i-1}$ represent amplitudes of the input data samples, $y_j$ represents an amplitude of a data output sample, and $\phi_j$ represents the phase of an output sample point relative to the immediately preceding input sample point ($0 \leq \phi_j < 1$). The amplitude of $y_j$ of the output sample point may be expressed as:

$$y_j = x_{i-1} + (x_i - x_{i-1}) \cdot \phi_j.$$

Thus, the output amplitude at a desired output sample point may be calculated from the data input amplitudes $x_i$ and $x_{i-1}$ and from the phase data $\phi_j$.

An example of digital filtering is represented by the waveforms shown in FIG. 4. Here, the input-to-output sampling frequency conversion ratio is assumed to be $L/M$, wherein L and M are integers. Sampling frequency conversion is carried out as follows:

First, L-1 zero-valued samples are filled between adjacent samples of the input sampling sequence $x_i$. As a consequence of such processing, the apparent sampling frequency is increased by a factor of L but the spectrum of the input sampling sequence remains unchanged. The sampling sequence with this increased sampling frequency then is convolved with (or multiplied by) a coefficient sequence $K_0$, $K_1$, $K_2$, ..., $K_r$, ..., $K_{2r-1}$, $K_{2r}$ which are samples of the impulse response of a low-pass filter having a pass band which passes the lower of the input sampling frequency $fs_{(in)}$ or the output sampling frequency $fs_{(out)}$ in a range up to L/2 times the passed sampling frequency. As a result of this multiplication processing, interpolated sample data having a sampling rate L times that of the input sampling frequency is obtained.

The interpolated sample data $y_j'$ whose sampling rate is L times the input rate may be represented as:

$$y_j = \ldots + x_{i-2} \cdot K_{r+L-L} \cdot \phi_j + x_{i-1} \cdot K_{r-L} \cdot \phi_j +$$
$$x_i \cdot K_{r-L-L} \cdot \phi_j + x_{i+1} \cdot K_{r-2L-L} \cdot \phi_j + \ldots$$
$$[\phi_j = \phi/L, 1/L, 2/L, \ldots, (L-1/L)].$$

In order to calculate the amplitude of one output sample, the Lth coefficients may be extracted and summed in a summation of products process that may be carried out by a digital signal processor (DSP) Then, the amplitude of the L-th output sample may be reduced by a factor 1/M, to produce an output data sample $y_j$ whose sampling frequency is converted to L/M relative to the input sampling frequency. By performing the foregoing calculation for each output sample point once for each M input data samples, the number of calculations can be reduced by the factor 1/M.

Obtaining the output sampling sequence $y_j$ by the aforementioned convolution calculation generally relies upon a high speed clock signal which is generated by increasing the input sampling frequency (or the output sampling frequency) many times. This multiple of the input data sampling frequency (or output data sampling frequency) is used to drive the digital signal processor.

Another prior art example of a sampling frequency converter is illustrated in FIGS. 5-7 In this example, the input data sequence is over-sampled by a fixed ratio, for example by a factor of 4, and the oversampled input data sequence is supplied to a buffer circuit from which four data samples are read, each being multiplied by a coefficient related to the phase difference between the input sampling clock Fs1 and the output sampling clock Fs2. The products are summed, thereby producing the desired output data sequence at the selected output sampling frequency, with the resultant output samples each exhibiting proper amplitude values.

As shown in FIG. 5, input data having an input sampling rate of $fs_1$ is supplied to a two-stage fixed ratio over-sampling filter 1 and is converted into data whose sampling frequency is a multiple of the input sampling rate. The first stage of over-sampling filter 1 operates to increase the input sampling frequency by $K_1$-times and, thus, may be considered a $K_1$-times over-sampling filter. Likewise, the second stage of filter 1 functions to increase the sampling rate of the samples supplied thereto from the first stage by a factor $K_2$. Hence, the second stage of filter 1 may be considered a $K_2$-times over-sampling filter. In a typical embodiment, $K_1 = K_2 = 2$, resulting in an increase in the input sample rate by a factor of 4. The output of over-sampling filter 1 is supplied to buffer 3. Within a period Ts1 of the input sampling clock Fs1, there are included four samples of the over-sampled input data, and these four samples are read out from buffer 3 during the period Ts1. The buffer write-in and read-out operations are controlled by an output of clock processor 4.

The four samples read from buffer 3 are multiplied by predetermined coefficients in a digital filter 2, the latter also being controlled by clock processor 4. As a result of this multiplication operation, output data samples having the desired sampling rate Fs2 are obtained.

The instantaneous relative time difference $dt_i$ between the input sampling clock Fs1 and the output sampling clock Fs2, that is, between the input and output data samples, is detected by clock processor 4. Based upon this relative time difference $dt_i$, buffer 3 and digital filter 2 are controlled in the manner described below.

FIG. 6 is a waveform diagram useful in understanding the operation of digital filter 2. In FIG. 6, the oversampled input data samples are represented as samples $x_i$, $x_{i+1}$, ..., having a sampling rate 4fs1; and output data samples $y_{i-1}$, $y_i$, ..., exhibit the sampling rate of Fs2 and are produced at times relative to the oversampled samples $x_i$, $x_{i+1}$, etc. The amplitude of an output sample $y_i$ is obtained by multiplying four oversampled samples $x_{i+3}$, $x_{i+4}$, $x_{i+5}$ and $x_{i+6}$ by coefficients $c_i$, $c_j$, $c_k$ and $c_l$, respectively, and then adding all of these products together. The coefficients $c_i$, $c_j$, etc. are samples of the impulse response of a low pass filter, similar to that shown in FIG. 4, represented by, for example, 32K samples. These coefficient samples are stored in a coefficient table C which is shifted so that its center coincides with the time at which output sample $y_i$ is produced Then, the coefficients $c_i$, $c_j$, $c_k$ and $c_l$ are selected from the coefficient table C at the times that oversampled data samples $x_{i+3}$, $x_{i+4}$, etc. are read from buffer 3.

The relative time difference dt between an input data sample, assumed to be sample $x_{i+3}$, and output sample $y_i$ (the precise position where an output sample amplitude is to be calculated) cannot be measured accurately due to clock jitter or the like. A time-related error in determining the position of the output sample causes an amplitude error in the sample amplitude calculation. This amplitude error must be kept below one quantizing step. That is, the least significant bit in an output sample cannot be erroneous. Since the relative time difference dt cannot be measured, it must be calculated to an accuracy of virtually 16 bits.

FIG. 7 is a block diagram of one prior art example of clock processor 4 used to provide an error-free updating of relative time difference dt(i) carried out by measuring and averaging the output sampling period Ts2 and accumulating relative time differences dt. The embodiment of FIG. 7 includes a phase locked loop circuit 5, a counter 6, a random access memory (RAM) 7, adders 8 and 9 and delay circuits 10 and 11. Phase locked loop 5 generates a clock signal whose frequency is a multiple of the input sampling frequency fs1, that is, a clock frequency equal to $2^k fs1$. This clock signal is used to measure the period Ts2 of the output sampling frequency fs2. This measured period is designated Ts2q(i) which is coarsely quantized with an accuracy of 6 to 7 bits. The measured output sampling period Ts2q(i) is averaged over a sufficiently long time period to increase its resolution to 16 bits (or more), and this averaged output sampling period is designated Ts2(est)(i). The average value Ts2(est)(i) must be measured such that no systematic down-rounding or up-rounding occurs over several samples because values due to such up-rounding or down-rounding accumulate as errors. To obtain the average value of clock period Ts2, a simple FIR averaging circuit, for example, one with a z-Transform $$H(z)=(1-z^{-n})/(1-z^{-1})$$

can be used. One advantage to such FIR averaging circuits is that they introduce no quantization error. In FIG. 7, RAM 7, adder 8 and delay circuit 10 function as averaging circuitry, and the value Ts2(est)(i) is provided at the output of adder 8.

When starting from an arbitrary or defined initial value dt(0), the relative time difference dt between input and output data samples is updated as $$dt(i+1)=[dt(i)+Ts2(est)(i)]Mod(Ts1).$$

With numerical values normalized to a unit of Ts1 = 1, the modulo operation requires no additional hardware.

In the aforedescribed prior art examples, calculation and control of the output data samples are carried out as a function of the relative time difference $dt_i$, and this relative time difference $dt_i$ is determined from the input sampling clock Fs1 and the output sampling clock Fs2. That is, once the time difference $dt_i$ is calculated, it is used to generate the addresses for the filter coefficients which, in turn, are used to multiply the oversampled input data samples to calculate the output data samples. This technique suffers from several disadvantages: the overall calculating process is complex and time-consuming. Also, since the read/write operations of the buffer have been controlled as a function of the time difference $dt_i$ produced by clock processor 4 (FIG. 5), such read/write control has been complicated.

SUMMARY AND OBJECTS OF THE INVENTION

Therefore, it is an object of the present invention to provide a sampling frequency conversion technique which overcomes the aforenoted drawbacks and disadvantages.

Another object of this invention is to provide a method and apparatus for converging a signal sampling frequency without relying upon the time difference dt between input and output data samples.

A further object of this invention is to provide a technique for generating addresses for selecting filter coefficients used for sampling frequency conversion which is of relatively simple yet accurate implementation.

An additional object of this invention is to provide sampling frequency conversion that suffers from minimal quantization error.

Various other objects, advantages and features of the present invention will become readily apparent from the ensuing detailed description, and the novel features will be particularly pointed out in the appended claims.

In accordance with one embodiment of this invention, a sampling frequency converter is provided for converting sampled input data having an input sampling frequency into sampled output data having a selected output sampling frequency. A relative ratio between periods of the input and output data samples is determined, and this determined ratio is averaged over a predetermined duration and used to generate filter coefficients which are used in a sampling filter circuit for converting the sampled input data into sampled output data.

In accordance with another embodiment, the sampling frequency of the sampled input data is increased by an over-sampling circuit, and the oversampled data is temporarily stored and subsequently read at a rate determined by the ratio between periods of the input and output sampling frequencies. The input sampling frequency periods as well as the output sampling frequency periods each are averaged; and both averaged periods are used to generate filter coefficients which are supplied to a variable filter that produces converted data samples by processing the oversampled data read from the buffer with the filter coefficients. Thus, converted data samples of the output sampling frequency are generated.

BRIEF DESCRIPTION OF THE DRAWINGS

The following detailed description, given by way of example, will best be understood in conjunction with the accompanying drawings in which.

DETAILED DESCRIPTION OF THE PREFERRED EMBODIMENTS

Figure 6:
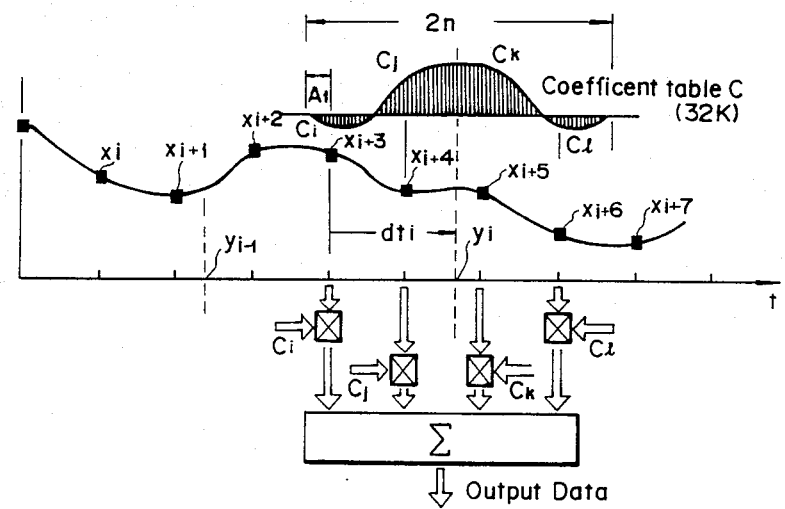
FIG. 6, described above, is a diagram useful in understanding the operation of the sampling frequency converter of FIG. 5.

Returning first to FIG. 6, the first coefficient $c_i$ of the four coefficients $c_i$, $c_j$, $c_k$ and $c_l$ is stored at an address $A_1$ of the coefficient table C. This address $A_1$ is related to the relative time difference dt(i) between input data sample $x_{i+3}$ and the time of occurrence of output data sample $y_i$ as follows:

$$A_1+dt(i)=0.5\times Ts1$$

$$A_1=0.5Ts1-dt(i).$$

It will be recognized that address $A_1$ is a positive quantity and always is less than 0.25. Accordingly, a more general formula for address $A_1$ is:

$$A_1=(Ts1-dt(i))\ Mod\ Ts1.$$

$A_1$ is the complement of $dt(i)$ Mod $Ts1$; and the calculation of $dt(i)$, as was done in the aforementioned prior art, can be replaced by the direct calculation of address $A_1$. The other addresses of the coefficient table, sometimes referred to herein as filter addresses, are:

$$A_2=(A_1+0.25)\ Mod\ Ts1$$

$$A_3=(A_2+0.25)\ Mod\ Ts1$$

$$A_4=(A_3+0.25)\ Mod\ Ts1.$$

In the foregoing equations, since $A_1$ is less than 0.25, the modulo operation is not actually needed.

Figure 7:
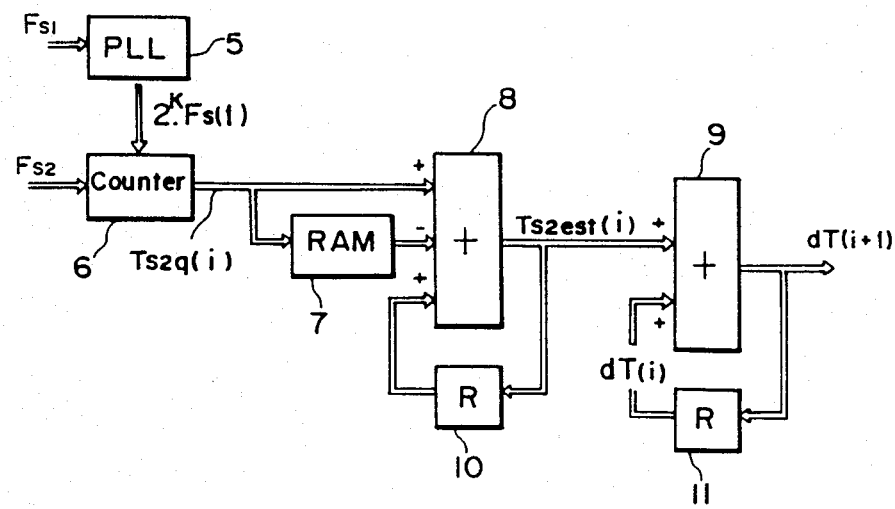
FIG. 7, described above, is a block diagram of one embodiment of the clock processor used in the sampling frequency converter of FIG. 5.
Figure 8:
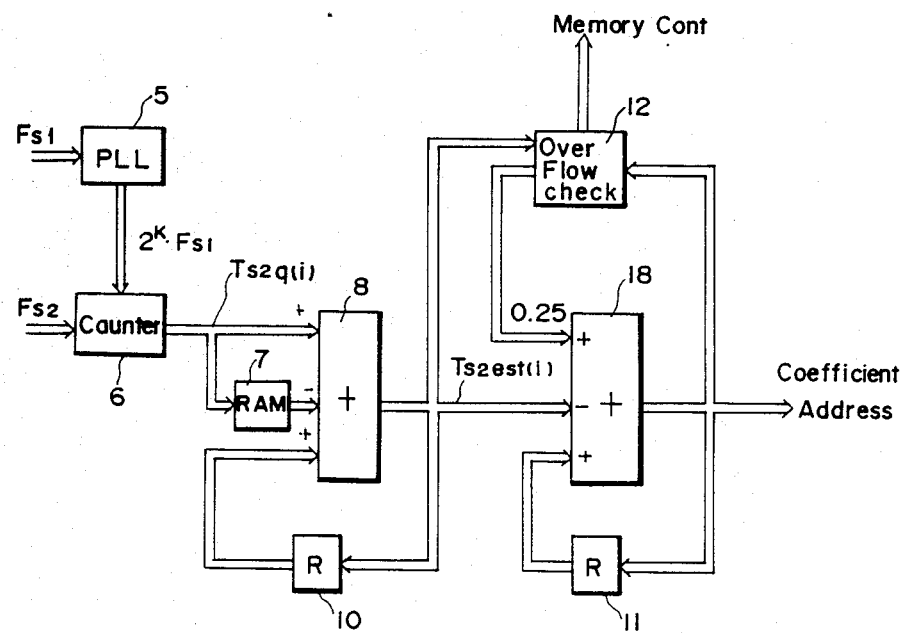
FIG. 8 is a block diagram of one embodiment of a sampling frequency converter clock processor in accordance with the present invention.

Turning now to one embodiment of the present invention, as shown in FIG. 8, this embodiment differs from the prior art shown in FIG. 7 in that the coefficient address as well as the buffer control are obtained directly from the averaged output sampling period Ts2(est)(i), produced at the output of adder 8. Whereas the prior art used the averaged output sampling period Ts2(est)(i) to calculate the relative time difference dt(i) which then was used to generate addresses $A_i$, the present invention avoids the complex and time-consuming steps needed in the calculation of dt(i).

Those elements shown in FIG. 8 which are the same as those described above in conjunction with FIG. 7 are identified by the same reference numerals. Further description of these previously described elements is not provided. From FIG. 8, it is seen that the output of adder 8 is coupled to an adder 18 which calculates the coefficient address used to read out the appropriate filter coefficient which, in turn, is used to multiply the input data sample to effect a sampling frequency conversion. The coefficient address is fed back to adder 18 by way of a delay circuit 11. The adder output also is supplied to an overflow check circuit 12 which selectively couples a fixed value to adder 18 for summation with the other inputs supplied to this adder, depending upon the presence or absence of a detected overflow.

It is appreciated that a sampling frequency conversion operation may increase the input sampling frequency, referred to herein as an "up convert", or it may decrease the input sampling frequency, referred to as a "down convert". The embodiment of overflow check circuit 12 in carrying out an up convert first will be described.

Figure 9:
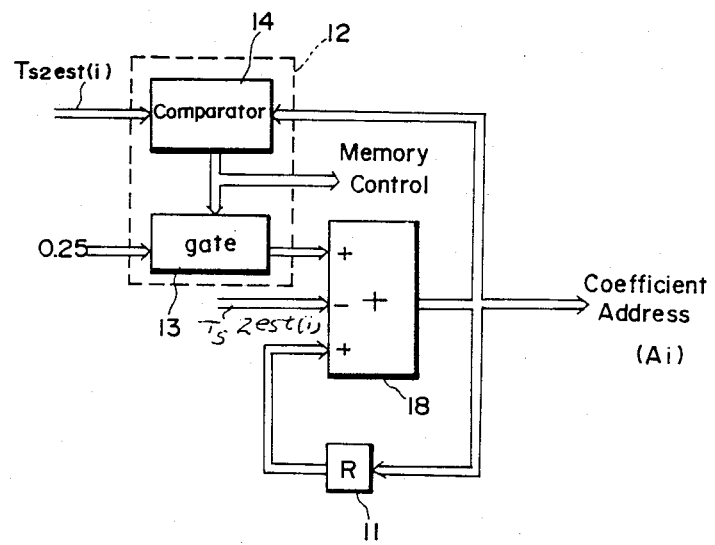
FIG. 9 is a block diagram of overflow check circuit 12 shown in FIG. 8.

Let it be assumed that the output sampling period Ts2 is 0.9 times the input sampling period. That is, the sampling frequency is increased by a factor 10/9. Referring to FIG. 9, overflow check circuit 12 used to carry out an up convert includes a comparator 14 which compares the coefficient address $A_i$ produced by adder 18 with the averaged output sampling period Ts2(est)(i) generated by adder 8 (FIG. 8). When the coefficient address $A_i$ is less than the averaged output sampling period Ts2(est)(i), the constant value 0.25 is added to the coefficient address so as to generate the next coefficient address. Conversely, when coefficient address $A_i$ is greater than the averaged output sampling period Ts2(est)(i), the constant value 0.25 is not added to the coefficient address. Thus, depending upon the output of comparator 14, the constant numerical value 0.25 is selectively supplied to adder 18 through a gate circuit 13 having an enable input coupled to the comparator.

Delay circuit 11 imparts a time delay of one period of the increased input sampling frequency, corresponding to one period of each sample that has been oversampled by the factor $2^k=4$. When the input and output sampling frequencies are relatively close to each other, as in the example assumed herein, coefficient addresses $A_1$, $A_2$ and $A_3$ will not be larger than the averaged output sampling period Ts2(est)(i), but coefficient address $A_4$ possibly may be larger than the averaged output sampling period Ts2(est)(i). At the time that the coefficient address $A_4$ is obtained at the output of adder 18, the averaged output sampling period Ts2(est)(i) is supplied to the adder to be subtracted from the other values then supplied thereto. The averaged output sampling period Ts2(est)(i) is not supplied to adder 18 at the time that addresses $A_1$, $A_2$ and $A_3$ are generated.

Figure 10:
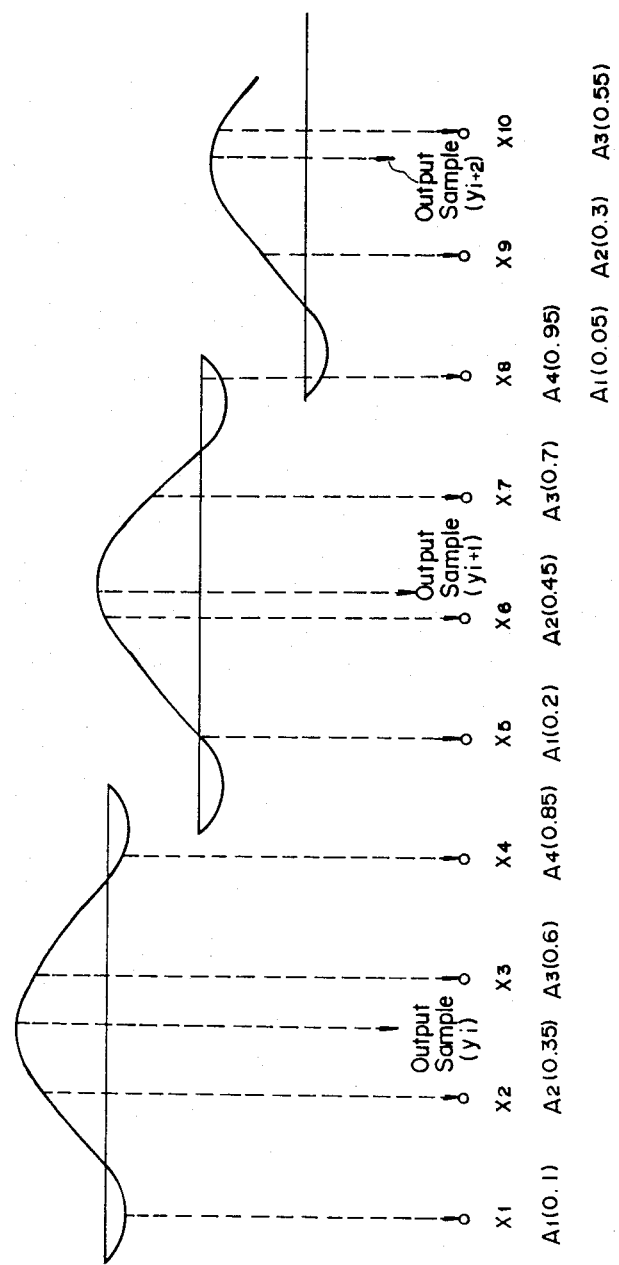
FIG. 10 is a waveform diagram useful in understanding the operation of the embodiment shown in FIG. 9.

To facilitate an understanding of the operation of FIG. 9, this embodiment now will be described with reference to specific examples of numerical values. These values are normalized, that is, the input sampling period Ts1 is normalized to unity, resulting in the averaged output sampling period Ts2(est)(i) becoming approximately 0.9. Referring to FIG. 10, input data samples $x_1$, $x_2$, . . . , represent the oversampled input data samples and the output data samples are represented as $y_i$, $y_{i+1}$, $y_{i+2}$, etc. The amplitudes of these three consecutive output data samples are to be calculated to effect proper frequency conversion. The relative times of occurrences of the output data samples and the oversampled input data samples are as illustrated. Furthermore, the low pass filter impulse response of period Ts1 is seen to be shifted so as to be centered at each output data sample. The amplitude of the impulse response at the time of occurrence of each oversampled input data sample is the filter coefficient with which that input data sample is multiplied. Closely spaced samples of the impulse response amplitude are stored in an addressable memory; and the address used to read out a respective sample is generated by adder 18.

In calculating the amplitude of output data sample $y_i$, the address of the coefficient to be multiplied by the oversampled input data sample $x_i$ is assumed to be 0.1. Then, the addresses of the coefficients to be multiplied by the subsequent oversampled input data samples $x_2$ $x_3$ and $x_4$ become:

$$A_2=A_1+0.25=0.35$$

$$A_3=A_2+0.25=0.6$$

$$A_4=A_3+0.25=0.85$$

In this case, each of coefficient addresses $A_1$ to $A_4$ is less than the averaged output sampling period Ts2(est)(i)

which has been defined as 0.9. Hence, comparator 14 determines that each of these addresses $A_i$ is smaller than the averaged output sampling period Ts2(est)(i) and activates gate 13. As a result, the coefficient $A_4$ and the constant value 0.25 are supplied as positive values to adder 18, while the averaged output sampling period Ts2(est)(i) is supplied as a negative value to the adder. Hence, address $A_1$ of the first coefficient for calculating the next output data sample $y_{i+1}$, that is, address $A_1$ of the coefficient to be multiplied by the next oversampled input data sample $x_5$ becomes:

$$A_1 = A_4 + 0.25 - Ts2(est) (i)$$
$$= 0.85 + 0.25 - 0.9 = 0.2.$$

In the manner discussed above, addresses $A_2$, $A_3$ and $A_4$ of the coefficients to be multiplied by the subsequent oversampled input data samples $x_6$, $x_7$ and $x_8$ become:

$$A_2 = A_1 + 0.25 = 0.45$$

$$A_3 = A_2 + 0.25 = 0.7$$

$$A_4 = A_3 + 0.25 = 0.95.$$

Now, the address $A_4$ of the coefficient to be multiplied by the oversampled input data sample $x_8$ has been calculated as 0.95 and is larger than the averaged output sampling period Ts2(est)(i) which has been assumed to be 0.9. Hence, comparator 14 functions to disable gate 13. As a consequence, in calculating address $A_1$ of the next coefficient which will be used to calculate the next output sample $y_{i+2}$, the value 0.25 is not added to the previous coefficient address $A_4$. Rather, only the averaged output sampling period Ts2(est)(i) is subtracted from coefficient address $A_4$. As can be seen from FIG. 10, the oversampled input data sample to be multiplied by the coefficient stored at address $A_1$ is not the next sample $x_9$ but, rather, input data sample $x_8$ is used once again. Thus, address $A_1$ of the coefficient to be multiplied by the oversampled input data sample $x_8$ for calculating the output sample $y_{i+2}$ becomes:

$$A_1 = A_4 - Ts2(est) (i)$$
$$= 0.95 - 0.9 = 0.05.$$

Figure 1:
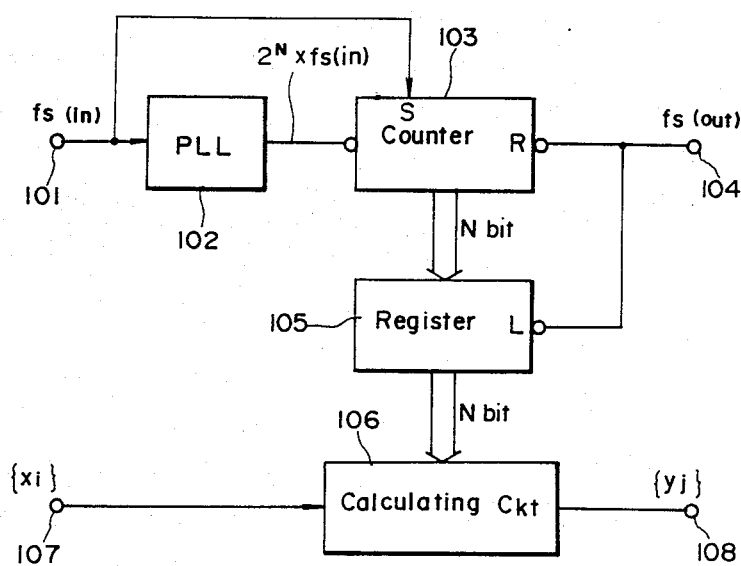
FIG. 1 is a block diagram, described above, showing a prior art sampling frequency converter.
Figure 2:
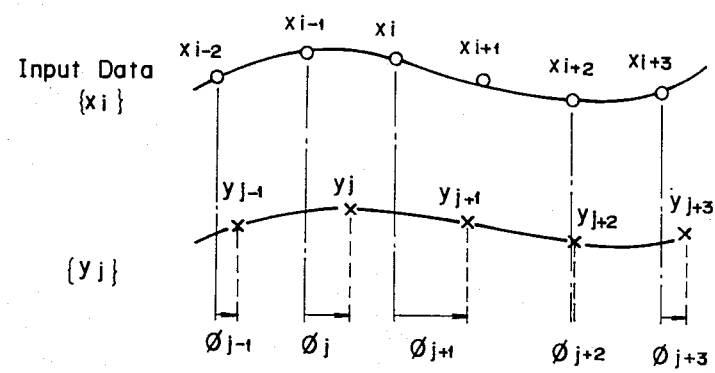
FIGS. 2-4, described above, are diagrams which are useful in understanding the operation of the prior art sampling frequency converter.
Figure 3:
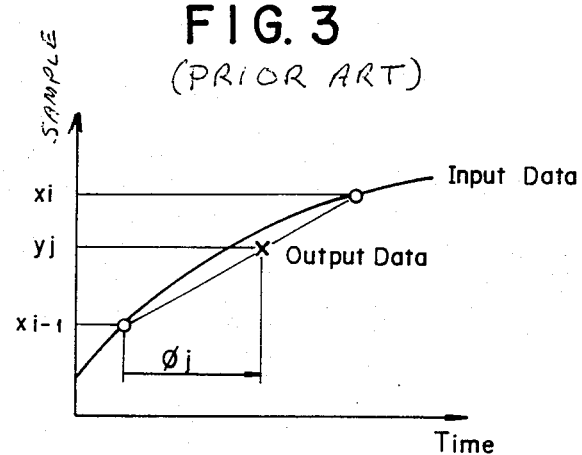
Figure 4:
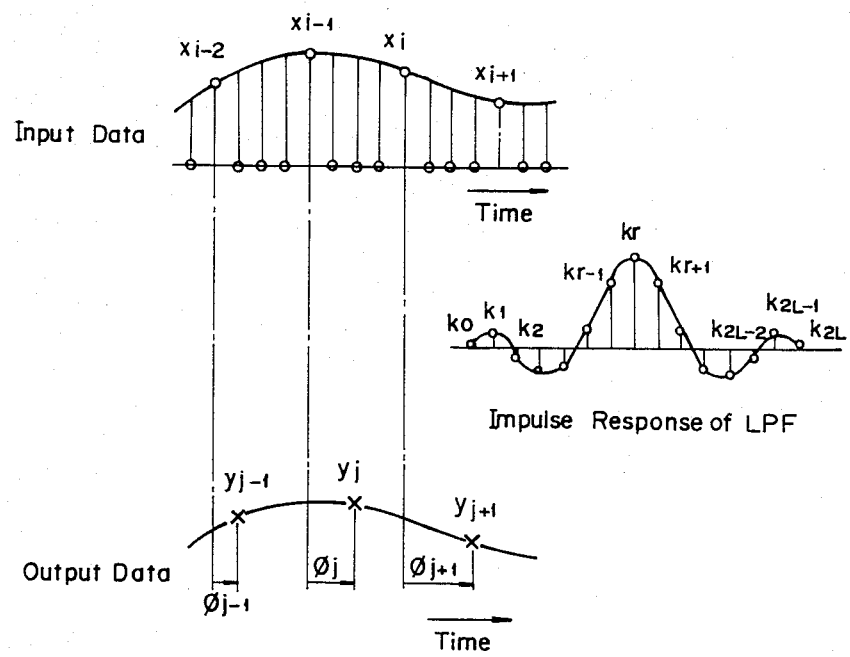
Figure 5:
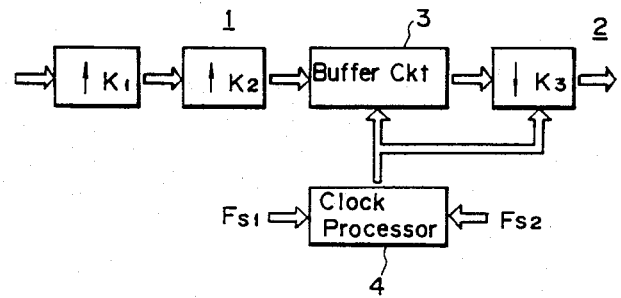
FIG. 5, described above, is a block diagram of another prior art sampling frequency converter.

As will be understood from the example just described, the output of comparator 14 indicates whether an oversampled input data sample is to be used again and, thus, the comparator output is used to control the read/write operation of buffer 3 shown in FIG. 5.

Figure 11:
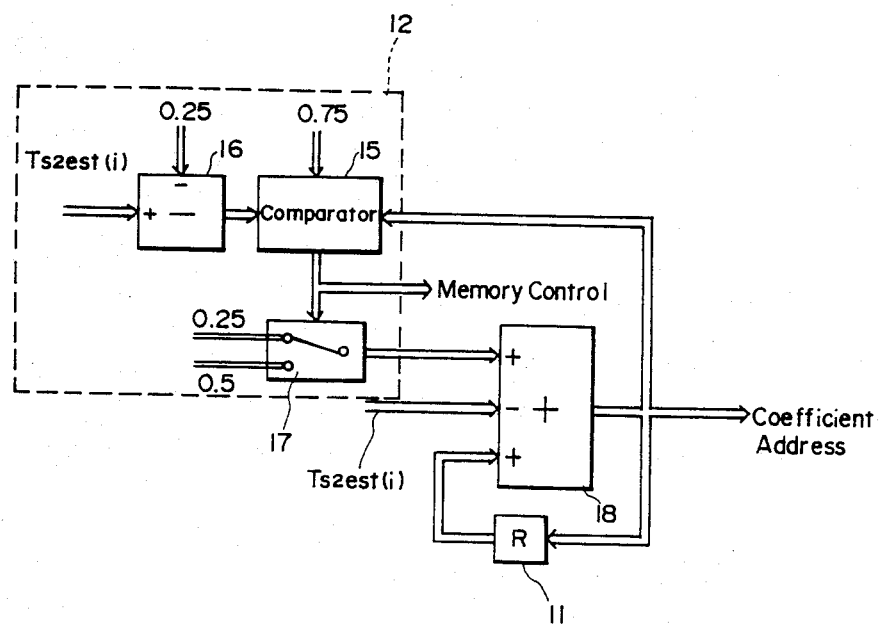
FIG. 11 is a block diagram of another embodiment of the overflow check circuit shown in FIG. 8.

Next, an embodiment of overflow check circuit 12 will be described for the arrangement wherein a down convert in the sampling frequency is to be carried out. For example, let it be assumed that the output sampling period Ts2 is increased to be equal to 1.1 times the input sampling period Ts1. That is, the sampling frequency is reduced by a factor 10/11. To carry out this down convert, overflow check circuit 12 is configured as shown in FIG. 11. Here, a subtractor 16 functions to subtract the fixed constant value 0.25 from the averaged output sampling period Ts2(est)(i) to obtain a value which, along with a constant value 0.75, is compared in a comparator 15 to the coefficient address $A_i$ produced by adder 18. Comparator 15 is coupled to a selector 17 to control the operation of the selector for supplying to adder 18 either a constant value of 0.25 or a constant value of 0.5. More particularly, selector 17 responds to the output of comparator 15 to select the constant value 0.5 when coefficient address $A_i$ is:

$$0.75 < A_i < Ts2(est)(i) - 0.25$$

Selector 17 also responds to the output of comparator 15 to supply to adder 18 the constant value 0.25 when the coefficient address $A_i$ is determined to be:

$$A_i < 0.75 \text{ or } A_i \geq Ts2(est)(i) - 0.25.$$

The constant value selected by selector 17 is added to the coefficient address $A_i$ by adder 18.

As described above, the coefficient addresses $A_1$, $A_2$ and $A_3$ each exhibit a value less than 0.75. Hence, when adder 18 generates coefficient address $A_1$ or $A_2$ or $A_3$, selector 17 selects the constant value 0.25 to be added to the preceding coefficient address which is fed back to adder 18 by delay circuit 11.

Figure 12:
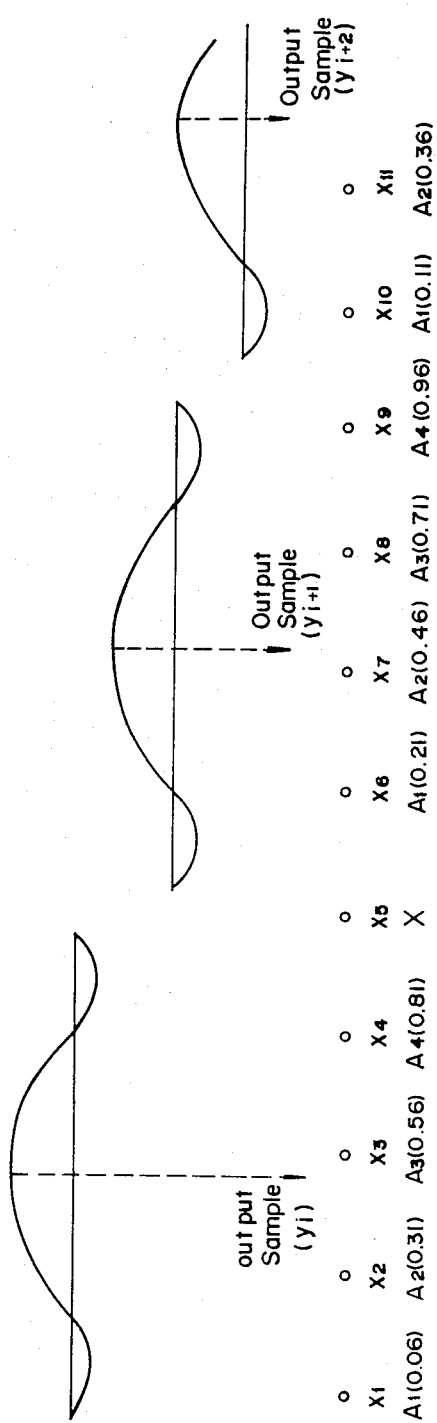
FIG. 12 is a waveform diagram useful in understanding the operation of the embodiment shown in FIG. 11.

An understanding of the operation of the overflow check circuit shown in FIG. 11 will be facilitated by reference to a specific numerical value. FIG. 12 illustrates waveforms similar to those shown in FIG. 10 and juxtaposes those waveforms with respect to oversampled input data samples $x_1$, $x_2$, etc. As was described previously in conjunction with FIG. 10, the illustrated impulse response characteristic is centered with respect to the time at which each output sample is to be produced.

Let it be assumed initially that the address of the first coefficient to be multiplied by input data sample $x_i$ for producing output data sample $y_i$ is 0.06. Then, the respective addresses of the coefficients to be multiplied by the subsequent oversampled input data samples $x_2$, $x_3$ and $x_4$ become:

$$A_2 = A_1 + 0.25 = 0.31$$

$$A_3 = A_2 + 0.25 = 0.56$$

$$A_4 = A_3 + 0.25 - 0.81$$

Since the averaged output sampling period Ts2(est)(i) is assumed to be 1.1, as described above, the output of subtractor 16 is $Ts2(est)(i) - 0.25 = 0.85$. Thus, coefficient address $A_4$ falls within the range $0.75 < A_4 < 0.85$ and comparator 15 controls selector 17 to select the constant value 0.5. Hence, the address $A_1$ of the coefficient to be multiplied by the next oversampled input data sample for calculating output data sample $y_{i+1}$ becomes $$A_1 = A_4 + 0.5 - Ts2(est) (i)$$
$$= 0.81 + 0.5 - 1.1$$
$$A_1 = 0.21.$$

As is apparent from FIG. 12, the input data sample to be multiplied by the coefficient at address $A_1$ is not $x_5$, which is the next sample and would be present at a time that the coefficient address would be $A_4 + 0.25 = 1.06$. Rather, sample $x_5$ is skipped. Hence, the next sample $x_6$ is multiplied by the coefficient at address $A_1 = 0.21$.

Addresses $A_2$, $A_3$, $A_4$ of the coefficients to be multiplied by the subsequent oversampled input data samples $x_7$, $x_8$, $x_9$ are:

$$A_2 = A_1 + 0.25 = 0.46$$

$$A_3 = A_2 + 0.25 = 0.71$$

$$A_4 = A_3 + 0.25 = 0.96.$$

Here, coefficient address $A_4$ is:

$$A_4 > Ts2(est)(i) - 0.25$$

and therefore comparator 15 now controls selector 17 to select the constant value 0.25. Thus, the address $A_1$ of the coefficient to be multiplied by the next oversampled input data sample for calculating the next output data sample $y_{i+2}$ becomes $$\begin{aligned} A_1 &= A_4 + 0.25 - Ts2(est)\,(i) \\ &= 0.96 + 0.25 - 1.1 \\ &= 0.11. \end{aligned}$$

From FIG. 12, it is seen that the next oversampled input data sample to be multiplied by the coefficient stored at address $A_1$ is sample $x_{10}$.

As will be understood from the foregoing description, the output of comparator 15 determines whether an oversampled input data sample is to be skipped. Hence, comparator 15, like comparator 14 of FIG. 9, is used for controlling the read/write operations of buffer 3 (FIG. 5).

The above-described embodiment of FIGS. 8–12 calculates the averaged output sampling period Ts2(est)(i) by using a high seed clock produced by increasing the input data sampling frequency fs1 (or, alternatively, the output data sampling frequency fs2) many times over, that is, by a factor $2^k$. As a result, the sampling frequency converter of this embodiment has employed a PLL circuit operating at a high speed for generating that clock signal, and the PLL circuit requires a sufficiently wide capture range to follow the variations in frequency of the sampling clock signal Fs1 or Fs2 which it multiplies. Further, it may be difficult to synchronize the DSP which calculates the approximate values of the output data samples because the DSP operates in response to the high speed clock signal generated by the PLL. Additionally in the above-described embodiment, the averaging process for determining the averaged output sampling period Ts2(est)(i) to improve accuracy in the sampling rate conversion is carried out in a so-called open-loop calculation or averaging method based on the z-Transform $$\begin{aligned} H(z) &= (1 - z^{-n})/(1 - z^{-1}) \\ &= 1 + z^{-1} + z^{-2} + \ldots + z^{-n+1}. \end{aligned}$$

Using this averaging method, if a step form phase error occurs, a control error is produced.

Figure 13:
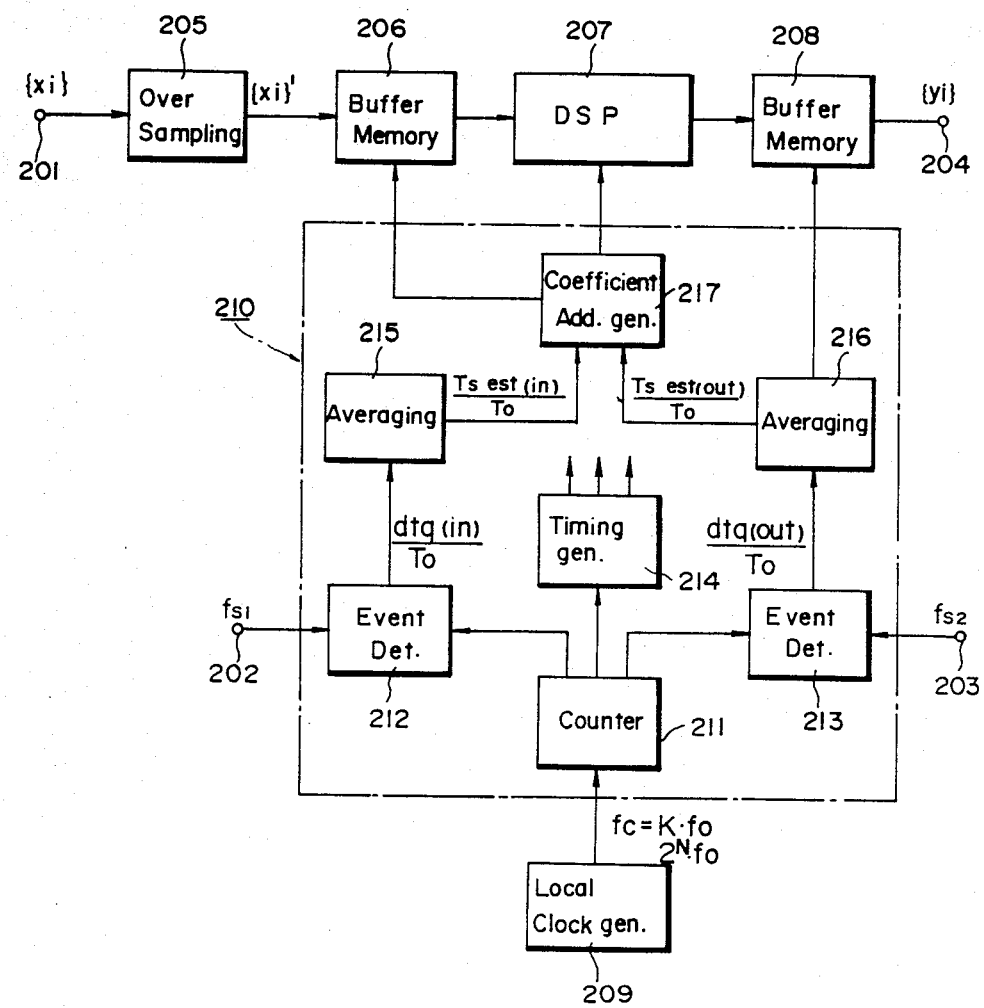
FIG. 13 is a block diagram of another embodiment of a sampling frequency converter in accordance with the present invention.

The aforenoted difficulties encountered in the just-described embodiment are overcome by a second embodiment of the present invention, shown in the block diagram of FIG. 13.

As illustrated, a signal input terminal 201 is supplied with the input data samples $(x_i)$ to be converted, and a clock signal input terminal 202 is supplied with an input sampling clock signal Fs1 of the input data sampling frequency fs1. A clock signal input terminal 203 is supplied with an output sampling clock signal Fs2 having the sampling frequency fs2 of the output data samples $(y_j)$ which are produced at a signal output terminal 204.

The sampling frequency converter comprises an oversampling circuit 205 for oversampling the input data samples $(x_i)$ supplied to the signal input terminal 201 to produce oversampled input data samples having a sampling frequency $2^M$ times the input sampling frequency fs1 (as an example, M=2). A buffer memory 206 is coupled to oversampling circuit 205 for temporarily storing sample values $[x_i]'$ of the oversampled input data samples having the sampling frequency 4.fs1. Digital signal processor (DSP) 207 is coupled to buffer 206 for subjecting the oversampled sequence $[x_i]'$ read out from the buffer to a digital filtering process using filter coefficients which are samples of the impulse response of a low-pass filter capable of passing the increased sampling frequency 4.fs1 to thereby calculate an interpolated amplitude value at a sample point of the output data sample $(y_j)$ whose sampling frequency thus has been converted to the output sampling frequency fs2. Another buffer memory 208 is coupled to DSP 207 for temporarily storing each of the interpolated amplitude values of the output data samples $(y_j)$. A local clock generator 209 generates a local clock signal Fc to provide a source of timing signals for buffer memories 206, 208 and digital signal processor 207. A conversion controller 210 is adapted to control the operations of buffer memories 206, 208 and digital signal processor 207 in response to the sampling frequencies fs1, fs2 derived from sampling clock signals Fs1, Fs2 supplied to clock signal input terminals 202, 203 and to the local clock frequency fc derived from the local clock signal Fc.

Figure 14:
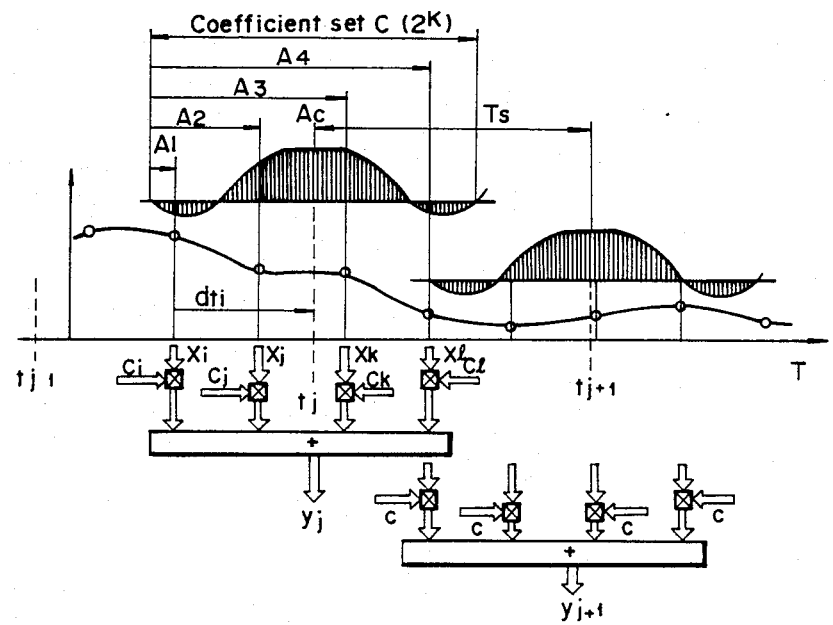
FIG. 14 is a waveform diagram useful in understanding the operation of the embodiment shown in FIG. 13.

Digital signal processor 207 reads out filter coefficients (of the type described above) from a coefficient memory (not shown) according to coefficient addresses supplied by a coefficient address generator 217 of conversion controller 210 and performs a multiply-and-add operation with these filter coefficients. For example, the digital signal processor, in response to the oversampled sequence $[x_i]'$ read from buffer memory 206, reads out four filter coefficients $c_i$, $c_j$, $c_k$ and $c_l$ which coincide in time to the sample points of the samples $x_i$, $x_j$, $x_k$ and $x_1$, respectively, as schematically shown in FIG. 14. These coefficients are included in a set of $2^k$ filter coefficients which constitute the impulse response characteristic of a low-pass filter to the sampling frequency 4.fs1. This set of coefficients is stored in, for example, a table, with the center address Ac of the coefficient filter set maintained coincident with a sample point $t_j$ of the output data sample sequence $[y_j]$. The four samples $x_i$, $x_j$, $x_k$, $x_l$ read from buffer 206 are multiplied by the filter coefficients $c_i$, $c_j$, $c_k$, $c_l$, respectively, and the products are summed, thereby calculating the interpolated output sample value $y_j$ at the sample point $t_j$.

Local clock generator 209 includes a quartz oscillator or the like oscillating at the local clock frequency fc. Preferably, fc=K.fo, where the factor K represents an integer that is a power of 2, such as 2N, and the frequency of represents a frequency higher than the input sampling frequency fs1 and higher than the output sampling frequency fs2. The sampling frequencies fs1, fs2 are generally close to 48kHz or below, and the frequency of also is selected close to 48kHz. The local clock frequency fc is of a frequency for which the DSP electronic circuitry (e. g. a DSP chip) constituting digital signal processor 207 is designed, and at this frequency, the digital filtering process in the digital signal processor is performed such that the quantization error of the output data samples ($y_j$) is kept below one quantizing step.

Conversion controller 210 comprises a modulo-K counter 211 for counting the local clock signal pulses Fc supplied from local clock generator 209 and event detectors 212, 213 for measuring the relative time differences $dt_{q1}/T_o$, $dt_{q2}/T_o$ between the clock period To (To=1/fo) and each of the sampling periods (Ts1=1/fs1 and Ts2=1/fs2) as a function of the count output of modulo-k counter 211. A timing generator 214 is included in controller 210 for generating various timing signals in response to the modulo-K count output; and first and second averaging circuits 215, 216 are used in the controller for calculating estimated sampling periods $Ts_{est}1/T_o$, $Ts_{est}2/T_o$ of the input and output sampling clock signals Fs1, Fs2, respectively, based upon the relative time differences $dt_{q1}/T_o$, $dt_{q2}/T_o$ measured by event detectors 212, 213. The conversion controller also includes a coefficient address generator 217 for calculating the coefficient addresses in response to the estimated sampling periods $Ts_{est}1/T_o$, $Ts_{est}2/T_o$ obtained by averaging circuits 215, 216, for selecting the approximate filter coefficients with which to multiply the samples read from buffer 206.

Event detectors 212, 213 are adapted to measure the relative time differences $dt_{q1}$, $dt_{q2}$ between each of the sampling periods Ts1, Ts2 and the clock period To, but such time differences cannot be measured in real time with high accuracy due to clock jitter or the like. Hence, in the present embodiment, clock edges or sync patterns for the sampling clock signals Fs1 and Fs2 are detected during every clock period To, it being recognized that To is shorter than either of the sampling periods Ts1 and Ts2. The calculating process for measuring the relative time differences $dt_{q1}$, $dt_{q2}$ uses clock signal pulses of period Tc (where Tc=1/fc) which are counted by modulo-K counter 211.

Figure 15:
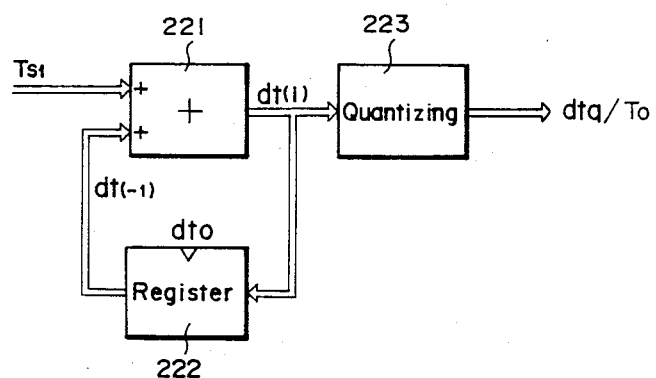
FIG. 15 is a block diagram of an event detector shown in FIG. 13.
Figure 16:
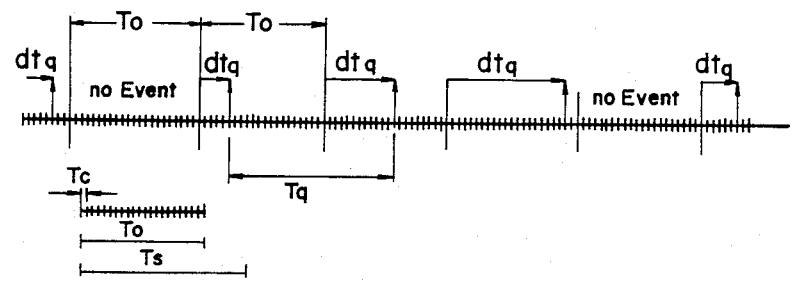
FIG. 16 is a diagram useful in understanding the operation of the event detector shown in FIG. 15.

Referring to the block diagram of FIG. 15, a functional representation of event detector 212 is shown. It will be appreciated that this block diagram also is representative of event detector 213. For convenience, the following description is referenced to event detector 212. An adder 221 supplied with information representing the input sampling period Ts1 adds this input sampling period information to information representing the relative time difference $dt_{(-1)}$ of the preceding input sampling period Ts1 temporarily stored in register 222. The output of adder 221 thus is indicative of the relative time difference dt between the input sampling period Ts1 and the clock period To. This relative time difference information dt is fed back for storage in register 222 and also is supplied to a quantizing circuit 223. The quantizing circuit, as shown in FIG. 16, measures the relative time difference information (dt) as a function of the number of local clock pulses $F_c$ counted during this time difference interval, that is, in units of the local clock period Tc, and calculates a measured relative time difference $dt_q/T_o$, which represents the ratio of the relative time difference dt to the clock period To.

Averaging circuits 215, 216, supplied with signals representing the measured relative time differences $dt_q1/T_o$ and $dt_q2/T_o$ obtained from event detectors 212 and 213, respectively, estimate the input and output sampling periods $Ts_{est}1/T_o$ and $Ts_{est}2/T_o$. These estimated sampling periods represent the ratio of the input sampling period Ts1 to clock period To and the ratio of the output sampling period Ts2 to clock period To. Referring to the block diagram of FIG. 17, averaging circuit 215 is illustrated as including an adder 251, supplied with a representation of the measured relative time difference $dt_q/T_o$ between the input sampling period and the clock period To and subtracts therefrom information representing an estimated relative time difference $dt_{est}/T_o$ supplied thereto from an adder 252. Adder 251 calculates an error between the measured time difference $dt_q/T_o$ and the estimated relative time difference $dt_{est}/T_o$. This error is monitored in an error monitor 253 coupled to adder 251. Correcting information $\Delta(Ts/T_o)$ for the next estimated input sample position, as shown in FIG. 18, is produced by a calculating circuit 254 based on the monitored error information, and this correcting information is supplied to a further adder 255.

Adder 255 adds the correcting information $\Delta(Ts1/T_o)$ to information representing the previous estimated input sampling period $(Ts_{est}1/T_o)_{(-1)}$ fed back through a register 256 and thereby calculates an estimated input sampling period $Ts_{est}1/T_o$. This estimated input sampling period is supplied to adder 252. At this point it should be noted that register 256 is supplied at the start with information of an initial value $Ts_{q0}$ of the estimated input sampling period from adder 255.

In averaging circuit 215, adder 252 adds information representing the estimated input sampling period $Ts_{est}1/T_o$ to information representing the previous estimated input sampling period $(Ts_{est}1/T_o)_{(-1)}$ fed back through a register 257 and thereby calculates the estimated relative time difference $dt_{est}/T_o$. This calculated information is supplied to adder 251. Register 257 is supplied at the start with an initial value $dt_{q0}$ of the estimated relative time difference from adder 252.

Information on the initial values $Ts_{q0}$ and $dt_{q0}$ supplied to registers 256 and 257 are obtained by direct quantized measurement of, for example, the relative time difference $dt_q$.

By supplying information on the estimated input sampling period $Ts_{est}1/T_o$ to adder 252 which calculates the estimated relative time difference $dt_{est}/T_o$, and by calculating an error between the measured relative time difference $dt_q/T_o$ and the estimated relative time difference $dt_{est}/T_o$, and furthermore by feeding back correcting information $\Delta(Ts1/T_o)$ to correct the estimated input sampling period $Ts_{est}1/T_o$, highly accurate information representing the estimated input sampling period $Ts_{est}/T_o$ is obtained by direct quantized measurement of the relative time difference $dt_q$ through adaptive estimation without using a filter per se. Further, by updating information on the estimated relative time difference $dt_{est}/T_o$ with an accurate estimated input sampling period $Ts_{est}/T_o$, the estimated relative time difference falls within the observed range of the measured relative time difference $dt_q$ for long durations. Correction of the estimated input sampling period with the correcting information $\Delta(Ts1/T_o)$ avoids excessive changes to the estimated input sampling period $Ts_{est}/T_o$ and, thus, phase inversion and distortion are not produced.

Figure 17:
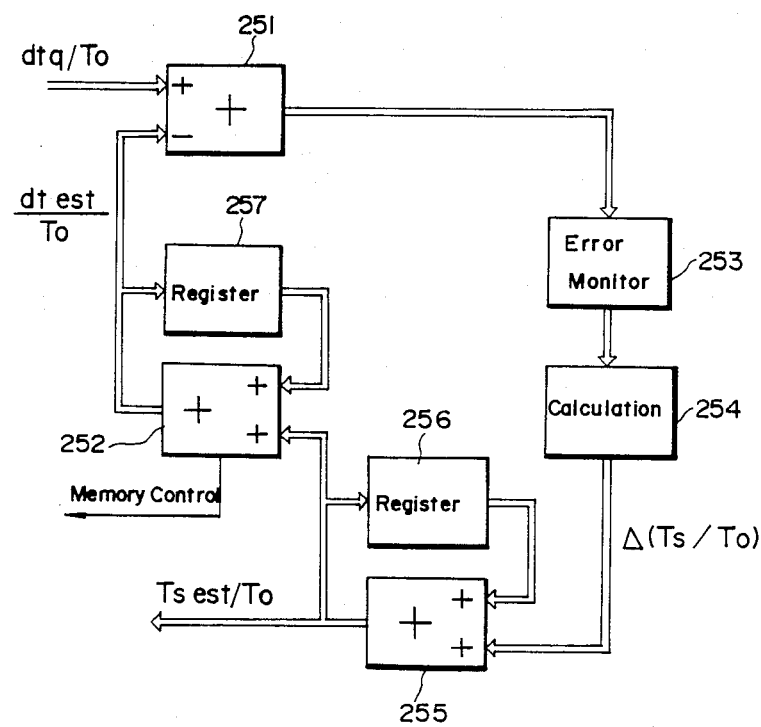
FIG. 17 is a block diagram of one embodiment of averaging circuit 215 shown in FIG. 13.
Figure 18:
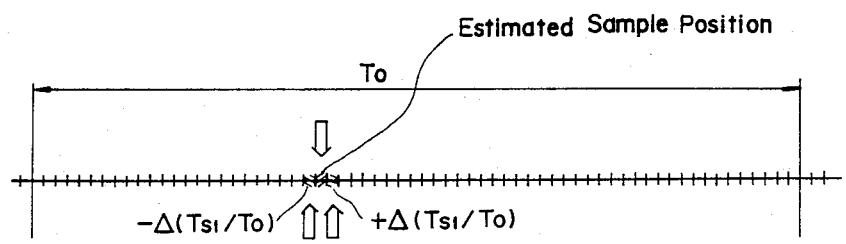
FIG. 18 is a diagram useful in understanding the operation of the averaging circuit shown in FIG. 17.

While FIG. 17 is illustrative of a functional block diagram of averaging circuit 215, it will be appreciated that FIG. 17 also is representative of averaging circuit 216. Therefore, the foregoing description is applicable to averaging circuit 216.

Event detector 212 (as an example) detects where the measured relative time difference $dt_{est}$ occurs compared to the estimated relative time difference $dt_q$. The history of this event is useful in calculating suitable corrections to the estimated input sampling period $Ts_{est}/To$. If, for example, it took 500 samples for the estimated input relative time difference $dt_{est}$ with a constant estimated input sampling period $Ts_{est}1$ to change from a value below the measured relative time difference $dt_q$ range to a value above that range, then the current error in the estimated input sampling period $Ts_{est}1$ is estimated as 1/500 of the quantization step for the measured relative time difference $dt_q$.

More complex cases based on monitoring the change in the estimated input sampling period $Ts_{est}1$ can of course be handled by more complex algorithms.

Coefficient address generator 217 is supplied with information representing the estimated input sampling period $Ts_{est}1/To$ provided by averaging circuit 215 with information representing the estimated output sampling period $Ts_{est}2/To$ provided by averaging circuit 216 to generate from the ratio of the estimated output sampling period to the estimated input sampling period the coefficient addresses for reading out the filter coefficients $c_i$, $c_j$, $c_k$, $c_l$ for use by digital signal processor 207 for interpolation processing.

For an embodiment of coefficient address generator 217, reference may be made to FIGS. 8, 9 and 11.

While the present invention has been particularly shown and described with reference to preferred embodiments, it will be appreciated that various changes and modifications may be made without departing from the spirit and scope of the invention. It is intended that the appended claims be interpreted to cover the disclosed embodiments, the aforementioned changes and modifications, and equivalents thereto.

What is claimed is:

1. A sampling frequency converter for converting sampled input data having an input sampling frequency into sampled output data having a selected output sampling frequency, said converter comprising:

circuit means for determining a relative ratio between periods of input data samples and output data samples and generating an output signal representing the relative ratio;

averaging means for averaging said output signal of said circuit means for a predetermined time duration and generating an averaged output;

filter coefficient generating means responsive to said averaged output for generating data representative of a set of predetermined filter coefficients derived from a low pass filter impulse response; said filter coefficient generating means including an addressable memory for storing said set of predetermined filter coefficients, means for providing a fixed output as a function of said generated averaged output, and adder means for adding the averaged output, said fixed value, and an output of said adder means for generating a memory address for reading out a filter coefficient; and sampling filter circuit means for converting said sampled input data into said sampled output data in response to said filter coefficients.

2. A sampling frequency converter according to claim 1, wherein said circuit means includes a phase locked loop circuit supplied with clock signals representing the frequency of one of said sampled input and sampled output data for frequency multiplying the supplied clock signals to generate a counting signal, and counter means for counting said counting signal during every period of clock signals representing the frequency of the other of said sampled input and sampled output data, thereby generating said output signal representing the relative ratio.

3. A sampling frequency converter according to claim 1, wherein said averaging means includes a circuit having a transfer function of $$H(Z) = \frac{1 - z^{-n}}{1 - z^{-1}}.$$

4. A sampling frequency converter according to claim 1, wherein said filter coefficient generating means additionally includes an overflow check circuit supplied with the output of said adder means to generate a control signal for selecting said fixed value.

5. A sampling frequency converter for converting sampled input data having an input sampling frequency into sampled output data having a selected output sampling frequency, said converter comprising:

over-sampling means supplied with said sampled input data for increasing the sampling frequency of said sampled input data by a factor $2^k$ (wherein $k>0$), to provide oversampled data;

buffer memory means supplied with said oversampled data for temporarily storing same and for reading out the stored oversampled data at a read-out rate determined by a ratio between periods of said input sampling frequency and said output sampling frequency;

averaging means for averaging periods of said input sampling frequency and for averaging periods of said output sampling frequency for a predetermined time duration;

filter coefficient generating means responsive to the averaged periods of said input sampling frequency and to the averaged periods of said output sampling frequency for generating data representing a set of predetermined filter coefficients derived from a low pass filter impulse response;

variable filter means for receiving the oversampled data read out from said buffer memory means and the filter coefficient data generated by said filter coefficient generating means for producing converted data samples; and output means for supplying the converted data samples at said output sampling frequency.

6. A sampling frequency converter according to claim 5, further comprising buffer control means for generating buffer control signals supplied to said buffer memory means and to control the read out of oversampled data from said buffer memory means.

7. A sampling frequency converter according to claim 5, wherein said averaging means comprises local clock means for generating a local clock signal, first means for determining a relative ratio between the period of said input sampling frequency and the period of said local clock signal, second means for determining a relative ratio between the period of said output sampling frequency and the period of said lock clock signal, and third and fourth means for averaging each of said ratios.

8. A sampling frequency converter according to claim 7, wherein said third means for averaging includes a first adder, means for supplying said first adder with a measured relative time difference between an input sampling period and said local clock period and with an estimated relative time difference therebetween such that said first adder determines an error between the measured and estimated relative time differences; error monitor means supplied with an error output of said first adder for producing a correction output; a second adder supplied with the correction output of said error monitor means and a previous estimate of an input sampling period produced by said second adder for generating a corrected estimate of the input sampling period; and a third adder supplied with the corrected estimate of the input sampling period generated by said second adder and a previous corrected estimate for generating said estimated relative time difference between said input sampling period and local clock period and supplying the estimated relative time difference generated thereby to said first adder.

9. A method of converting sampled input data having an input sampling frequency into sampled output data having a selected output sampling frequency, said method comprising the steps of:
   determining a relative ratio between a period of the input sampling frequency and a period of the output sampling frequency;
   averaging said relative ratio for a predetermined time duration;
   generating predetermined filter coefficients derived from a low pass filter impulse response in response to the averaged relative ratio by storing a set of predetermined filter coefficients, generating a summation output by adding the averaged relative ratio of a fixed value, the fixed value being a function of the summation output, and using the summation output to generate a memory address for reading out a filter coefficient; and
   converting said sampled input data into said sampled output data in response to said filter coefficients.

10. The method of claim 9 wherein the step of determining a relative ratio comprises providing input clock signals having the input sampling frequency and providing output clock signals having the output sampling frequency; frequency multiplying the frequency of a selected one of the input or output clock signals; and counting the frequency-multiplied clock signals during every period of the non-multiplied clock signals, thereby generating an output signal representing the relative ratio.

11. The method of claim 9 wherein the fixed value is generated only when said summation output is less than said averaged relative ratio and said output sampling frequency exceeds said input sampling frequency.

12. The method of claim 9 wherein a first fixed value is generated when said summation output falls within a range between first and second predetermined amounts, said second predetermined amount being a predetermined fraction of said averaged relative ratio, and a second fixed value is generated when said summation output is less than said first amount or greater than said second amount, provided that said output sampling frequency is less than said input sampling frequency.

13. A method of converting sampled input data having an input sampling frequency into sampled output data having a selected output sampling frequency, said method comprising the steps of:
   over-sampling the sampled input data to increase the sampling frequency thereof by a factor $2^k$ (wherein $k > 0$), to provide oversampled data;
   temporarily storing the oversampled data and reading out the stored oversampled data at a read-out rate determined by a ratio between a period of said input sampling frequency and a period of said output sampling frequency;
   averaging the periods of said input sampling frequency and averaging the periods of said output sampling frequency for a predetermined time duration;
   generating predetermined filter coefficients derived from a low pass filter impulse response in response to the averaged periods of said input sampling frequency and the averaged periods of said output sampling frequency;
   variably filtering the read out oversampled data by processing the read out oversampled data with the filter coefficients for producing the converted data samples; and
   supplying the converted data samples at said output sampling frequency.

14. The method of claim 13 wherein the step of averaging comprising generating a local clock signal, determining a relative ratio between the period of said input sampling frequency and a period of said lock clock signal, determining a relative ratio between the period of said output sampling frequency and the period of said local clock signal, and averaging each of said ratios.

15. The method of claim 14 wherein the step of averaging the relative ratio between the input sampling period and the local clock period comprises adding a measured relative time difference between the input sampling period and the local clock period and an estimated relative time difference therebetween to detect an error between the measured and estimated relative time differences; producing a correction output in response to the detected error; adding the correction output and a previous estimate of the input sampling period for generating a corrected estimate of the input sampling period; and adding the corrected estimate of the input sampling period and a previous corrected estimate for producing said estimated relative time difference between said input sampling period and said local clock period; and wherein the corrected estimate of the input sampling period is the averaged relative ratio between the input sampling period and the local clock period.

* * * * *